United States Patent
Kumar et al.

(10) Patent No.: US 10,566,046 B1
(45) Date of Patent: Feb. 18, 2020

(54) PROTOCOL COMPLIANT HIGH-SPEED DDR TRANSMITTER

(71) Applicant: Cadence Design Systems, Inc., San Jose, CA (US)

(72) Inventors: Vinod Kumar, Pratapgarh (IN); Thomas E. Wilson, Laurel, MD (US); Hari Anand Ravi, Bangalore (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 16/175,577

(22) Filed: Oct. 30, 2018

(51) Int. Cl.
  *H03K 3/00*        (2006.01)
  *G11C 11/4093*     (2006.01)
  *H03K 3/57*        (2006.01)
  *H03K 17/687*      (2006.01)

(52) U.S. Cl.
  CPC .......... *G11C 11/4093* (2013.01); *H03K 3/57* (2013.01); *H03K 17/6872* (2013.01)

(58) Field of Classification Search
  CPC ......... H01L 2924/00; H01L 2924/0002; H01L 29/7813; H01L 27/0623; H01L 27/0629
  See application file for complete search history.

(56) References Cited

U.S. PATENT DOCUMENTS 9,997,214 B1   6/2018  Kumar et al.
2007/0001716 A1*  1/2007  Sanchez .......... H03K 19/00315
                                                  327/112

* cited by examiner

*Primary Examiner* — Sibin Chen
(74) *Attorney, Agent, or Firm* — Foley & Lardner LLP

(57) ABSTRACT

Implementations described herein relate to circuits and techniques increasing transmitter output speed. In some implementations, a circuit is described using a pull-up data path comprising a first flying capacitor, a first buffer, a thin-oxide PMOS device, and a thick-oxide PMOS device, a pull-down data path comprising a second flying capacitor, a second buffer, a thin-oxide NMOS device, and a thick-oxide NMOS device, wherein the pull-up data path and the pull-down data path are operatively connected to a core data output signal line.

12 Claims, 7 Drawing Sheets

PROTOCOL COMPLIANT HIGH-SPEED DDR TRANSMITTER

TECHNICAL FIELD

The present implementations relate generally to interface circuits with memory devices (e.g., double data rate (DDR) memory), and more particularly to memory interface transmitters for use with such memory devices.

BACKGROUND

A typical computing device is implemented with a microprocessor, memory, and a number of other modules depending on the function to be performed by the computing device. DDR random access memory (RAM) is a particular type of RAM commonly used in current technology that performs two read accesses or two write accesses per clock cycle. Microprocessors and DDR RAM both operate on different power supply voltages. Interface circuits that can convert between different signal levels and different drive levels are used to allow for compatible communications between microprocessors and memory devices.

As the DRAM sector approaches higher speeds in current and proposed DDR standard protocols, and while power and area restrictions continue to be imposed on interface circuits, their performance can suffer. A solution to these and other problems is thus desirable.

SUMMARY

Implementations described herein relate to circuits and techniques for transmitting data from integrated circuits and printed circuit boards, particularly from high speed memory devices such as DDR SDRAM in accordance with protocols such as GDDR6. Some implementations particularly relate to a transmitter architecture for a DDR memory interface device.

One aspect of the present disclosure relates to a circuit for data transmission. The circuit may include a pull-up data path comprising a first flying capacitor, a first buffer, a thin-oxide PMOS device, and a thick-oxide PMOS device. The circuit may further comprise a pull-down data path comprising a second flying capacitor, a second buffer, a thin-oxide NMOS device, and a thick-oxide NMOS device. The pull-up data path and the pull-down data path may be operatively connected to a core data output signal line. In some implementations, the thin-oxide PMOS device is configured as a data dependent pull-up switch and is driven by an output of the first flying capacitor. In some implementations, the first buffer and first flying capacitor are operatively connected to a core data output signal line where the core data output signal line is an input of the first flying capacitor, where the core data output signal line is an input of the first buffer, and wherein an output of the first flying capacitor is phase aligned with an output of the first buffer and used to drive the thin-oxide PMOS device. In some implementations, the thick-oxide PMOS device is driven by the phase aligned output of the first buffer. In some implementations, the thin-oxide NMOS device is configured as a data dependent pull-down switch and is driven by an output of the second buffer. In some implementations, the second buffer and second flying capacitor are operatively connected to a core data output signal line where the core data output signal line is an input of the second flying capacitor, where the core data output signal line is an input of the second buffer, and wherein an output of the second flying capacitor is phase aligned with an output of the second buffer and used to drive the thick-oxide NMOS device. In some implementations, the thin-oxide NMOS device is driven by the phase aligned output of the second buffer.

Another aspect of the present disclosure relates to a system for data transmission. The system may comprise a first flying capacitor configured to level shift from a core voltage level to a data transmission voltage level, a thin-oxide PMOS device configured as a data dependent pull-up switch and driven by an output of the first flying capacitor, and a thick-oxide PMOS device configured to protect the thin-oxide PMOS device from voltage stress and driven by core voltage level digital data. In some implementations, the system further comprises a second flying capacitor configured to level shift from a core voltage level to a data transmission voltage level, a thin-oxide NMOS device configured as a data dependent pull-down switch and driven by an output of the second buffer, and a thick-oxide NMOS device configured to protect the thin-oxide NMOS device from voltage stress and driven by the output of the second flying capacitor. In some implementations, the system further comprises a first buffer operating on the core voltage level and configured to buffer the core voltage level digital data to the thick-oxide PMOS device and a second buffer operating on the core voltage level and configured to buffer the core voltage level digital data to the thin-oxide NMOS device. In some implementations, the core voltage level digital data is an input of the first flying capacitor, the core voltage level digital data is an input of the second flying capacitor, an output of the first flying capacitor is phase aligned with an output of the first buffer and used to drive the thin-oxide PMOS device, and an output of the second flying capacitor is phase aligned with an output of the second buffer and used to drive the thick-oxide NMOS device. In some implementations, the thick-oxide PMOS device is driven by the phase aligned output of the first buffer and the thin-oxide NMOS device is driven by the phase aligned output of the second buffer.

Another aspect of the present disclosure relates to a method of data transmission. The method may include receiving a data signal at a first voltage level, splitting the data signal to a pull-up data path and a pull-down data path, level shifting the pull-up data path signal using a first flying capacitor, level shifting the pull-down data path signal using a second flying capacitor, and combining the pull-up data path signal and the pull-down data path signal to create an output data signal at a second voltage level. In some implementations, the method further comprises splitting the pull-up data path signal prior to level shifting, buffering the pull-up data path signal prior to level shifting using a first buffer operating on the first voltage level, splitting the pull-down data path signal prior to level shifting, buffering the pull-down data path signal using a second buffer operating on the first voltage level. In some implementations, the method further comprises phase aligning the level shifted pull-up data path signal and the buffered pull-up data path signal and phase aligning the level shifted pull-down data path signal and the buffered pull-down data path signal. In some implementations, the method further comprises driving a thin-oxide PMOS device using the phase aligned level shifted pull-up data path signal, driving a thick-oxide PMOS device using the phase aligned buffered pull-up data path signal, driving a thick-oxide NMOS device using the phase aligned level shifted pull-down data path signal, and driving a thin-oxide NMOS Device using the phase aligned buffered pull-down data path signal. In some implementations, the method further comprises phase aligning the level shifted pull-up data path signal and the pull-up data path signal and phase aligning the level shifted pull-down data path signal and the pull-down data path signal.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

Figure 1:
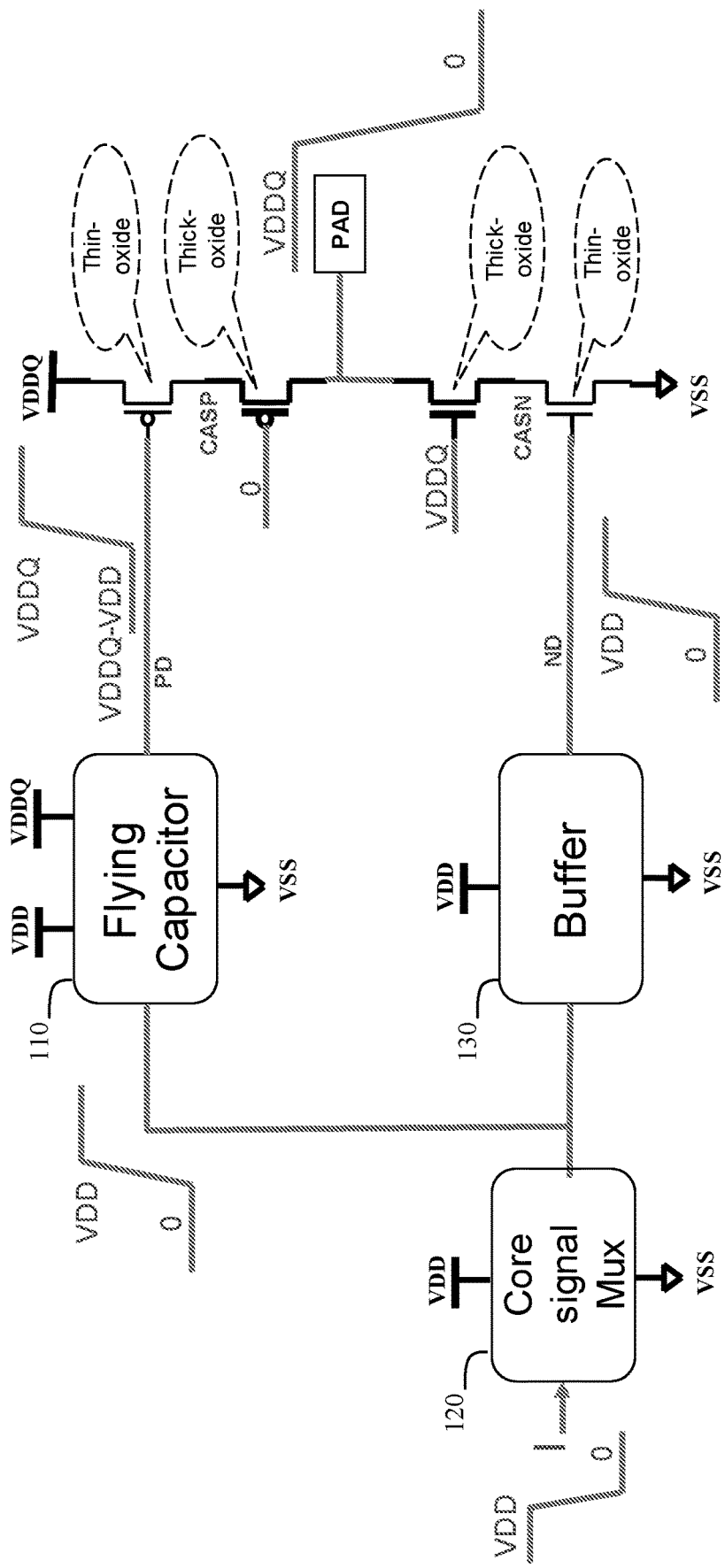
FIG. 1 is a block diagram of an example high-speed output driver architecture using a flying capacitor.

Implementations described herein relate to circuits and techniques for interfacing a microprocessor with memory devices, particularly memory devices such as DDR SDRAM in accordance with protocols and standards such as GDDR6. GDDR6 is a memory interface standard requiring Joint Electron Device Engineering Council (JEDEC) protocol POD135 (pseudo open drain at 1.35V) and/or POD125 (pseudo open drain at 1.25V) compliant signaling at up to 18 Gbps. Existing high-speed DDR driver architectures are able to work up to 6.4 Gbps for DDR4/DDR5 applications where the memory interface voltage (i.e., VDDQ) is less than 1.26V. In the most recent available state of the art GDDR6 Tx (i.e. transmitter) architecture (e.g., ISSCC 2018) most of the transmitter signaling stages use memory interface voltage levels This requires most of the TX stages to be designed using thick-oxide Input/Output (i.e., I/O) devices thus taking up more integrated circuit area. Also, since the memory interface voltage supply (i.e., VDDQ) is higher than the core voltage supply (i.e., VDD), this leads to higher switching current from the VDDQ supply voltage and effectively higher power consumption in the transmitter.

In addition, higher switching current from a VDDQ supply adds more noise on the VDDQ supply and requires additional decoupling capacitors on the supply at chip level. Also, thick-oxide I/O devices are slower when compared with thin-oxide core devices and therefore the thick-oxide based transmitter needs lot of intermediate equalization in the data path to get the performance at higher speed.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

FIG. 1 illustrates an example high-speed output driver architecture 100 using a flying capacitor. The high-speed output driver architecture 100 uses a flying capacitor to level shift the core signal and uses thick-oxide devices with cascode thin-oxide devices to protect the thin-oxide devices from voltage stress. For example, the voltage stress tolerance limit for some nodes of thin-oxide devices may be less than 0.9V. The voltage stress across thin-oxide crosses the tolerance limit of thin-oxide devices for VDDQ supply larger than or equal to 1.01V.

The physical characteristics of thin-oxide and thick-oxide NMOS and PMOS transistors may be dependent upon a manufacturing technology, or technology node, used to manufacture electronic circuits including the thin-oxide and thick-oxide NMOS and PMOS transistors. Each new technology node may decrease circuit sizes and dimensions while increasing circuit speed compared to the prior technology node. As the line width decreases in each new technology node, the oxide thicknesses of CMOS transistor devices may also decrease correspondingly. Thus, whether a semiconductor device is considered a thin-oxide device or a thick-oxide device is dependent upon the technology node in which the semiconductor device is manufactured and depends upon the relative thicknesses of the gate oxide in the thin-oxide device and the thick-oxide device. In various embodiments, a thick-oxide NMOS or PMOS transistor may have a gate oxide thickness greater than a thin-oxide NMOS or PMOS transistor in the same technology node, for example, by 10%, 15%, 20%, 25%, or some other number as appropriate in the technology node used to manufacture the high-speed output driver architecture 100.

The example high-speed output driver architecture 100 comprises a flying capacitor 110. In some implementations, flying capacitor 110 takes a digital input of 0V (i.e., logic low) to VDD voltage level (i.e. logic high using a core voltage level) and level shifts the input to give the output at VDDQ-VDD (i.e., logic low comprising output voltage level minus core voltage level) to VDDQ (i.e., logic high comprising output voltage level). The flying capacitor 110 steps up the voltage through functionality where it charges a capacitor by charging a capacitor and then switching connection to a second capacitor resulting in an inductorless voltage boost. In other words, a "flying" capacitor is charged from the supply signal and then the connection is switched so the charged flying capacitor is connected to another, already charged, reservoir capacitor. Charge flows from the flying capacitor to the reservoir capacitor, thus increasing the output voltage according to fundamental relationships among charge, voltage, and capacitance. The flying capacitor is then switched back to the supply signal.

The example high-speed output driver architecture 100 comprises a core signal multiplexer 120. The multiplexer 120 allows for the selection of a plurality of internal core signals to be output as the signal to the flying capacitor 110 and the buffer 130.

The example high-speed output driver architecture 100 comprises a buffer 130. In some implementations, the buffer 130 (i.e., buffer amplifier) provides electrical impedance transformation from one portion of the high-speed output driver architecture 100 to another. In some implementations, the buffer 130 acts as a unity gain buffer as the output voltage tracks the input voltage. In some implementation, the buffer is combination of two series inverters which takes a digital signal as an input and outputs the digital signal in the same phase with enhanced signal strength.

Figure 2:
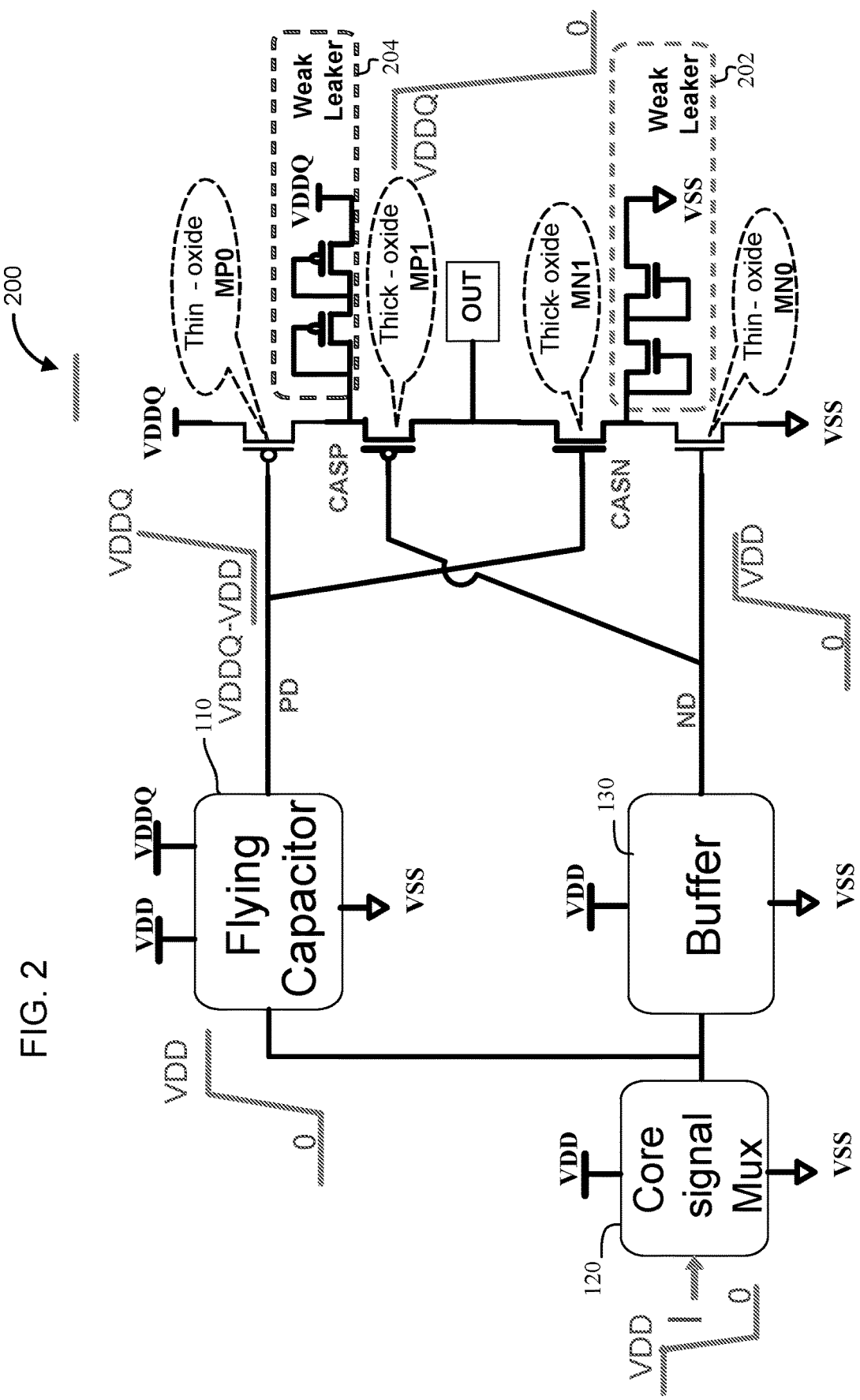
FIG. 2 is a block diagram illustrating an example high-speed output driver with weak leakers.

FIG. 2 is a block diagram illustrating an example high-speed output driver 200 with weak leakers. In some implementations, the high-speed output driver architecture 200 comprises a flying capacitor 110, a core signal multiplexer 120, and a buffer 130. The high-speed output driver architecture 200 uses a flying capacitor to level shift the core signal and uses thick-oxide devices with cascode thin-oxide devices to protect the thin-oxide devices from voltage stress. For example, the voltage stress tolerance limit for thin-oxide devices in ss7lpp is less than 0.9V. The voltage stress across thin-oxide crosses the tolerance limit of thin-oxide devices for VDDQ supply larger than or equal to 1.01V. Therefore, for example, if maximum VDDQ is 1.26V, then weak leakers 202 need to be put at nodes CASN and CASP to control voltage stress across the thin-oxide devices. For greater VDDQ voltages (e.g., greater than 1.26V), leaker current increases and may introduce error in the impedance of a calibrated output driver. The weak leakers 202, 204 have a turn on voltage, for example of 0.5V, and protect the thin-oxide devices in the output driver from voltage stress when the output driver goes in high impedance (i.e., Hi-Z) state.

Still referring to FIG. 2, in some implementations, the normal mode of operation of the weak leaker 202 connected on CASN is to auto turn-off as VDDQ-VDD-Vthn is much less than 0.5V, the minimum turn-on threshold of the weak leaker, to avoid disturbing the calibrated output pull-down driver impedance. VDD is the core voltage (e.g., of the memory integrated circuit) and Vthn is the threshold voltage of the weak leaker NMOS device. The weak leaker 204 connected on CASP is to auto turn-off as VDDQ-VDD-Vthp is much less than 0.5V, the minimum turn-on threshold of the weak leaker, to avoid disturbing the calibrated output pull-up driver impedance. VDD is the core voltage (e.g., of the memory integrated circuit) and Vthp is the threshold voltage of the weak leaker PMOS device. The weak leakers 202, 204 turn-on only when the output driver is in Hi-Z mode with the maximum leakage from the PAD is less than 0.5 mA (e.g., for DDR4 application). In some implementations, where maximum speed is less than 2.2 Gbps, (e.g., for DDR, DDR3L, etc.) a level shifted 'Enable' can be used to turn-off the cascode thick-oxide devices to cut-down on the leaker current.

However, since the same flying capacitor output (PD) is connected to both the thin-oxide and the thick-oxide devices in the output driver, the switching coupling from thick-oxide devices on node PD degrades the output driver performance and can potentially lose timing margin at higher speed. In addition, when the output driver is in Hi-Z mode (e.g., in a GDDR6 application), the leaker current may increase the PAD leakage to an unacceptable level. In this case, a level shifted enable cannot be used to turn-off the leaker in Hi-Z state as it will create mismatch between 'I' to PAD and 'Enable' to PAD delay by more than an acceptable amount (e.g., more than 1.1 ns which is equivalent to 20 bits of data at 18 Gbps) and would limit the transmitter bandwidth. The weak leaker 202 connected on CASP and CASN can get turned on even in normal mode of operation. For example, at a GDDR6 supply voltage level, VDDQ-VDD-Vthn would be greater than the leakers minimum turn-on threshold voltage of 0.5V. the weak leaker turning on in normal mode changes the calibrated output driver impedance and degrades the output driver performance. This error in calibrated output driver impedance impacts the output transient performance of the transmitter as well as signal integrity. Since the leakage is voltage and temperature dependent, the leakage may dynamically change the common mode of the transmitter output signal. Thus, a different architecture is needed where the speed requirement and/or the output voltages are higher (e.g., an 18 Gbps speed requirement with maximum VDDQ of 1.485 (1.35V±10%).

Figure 3:
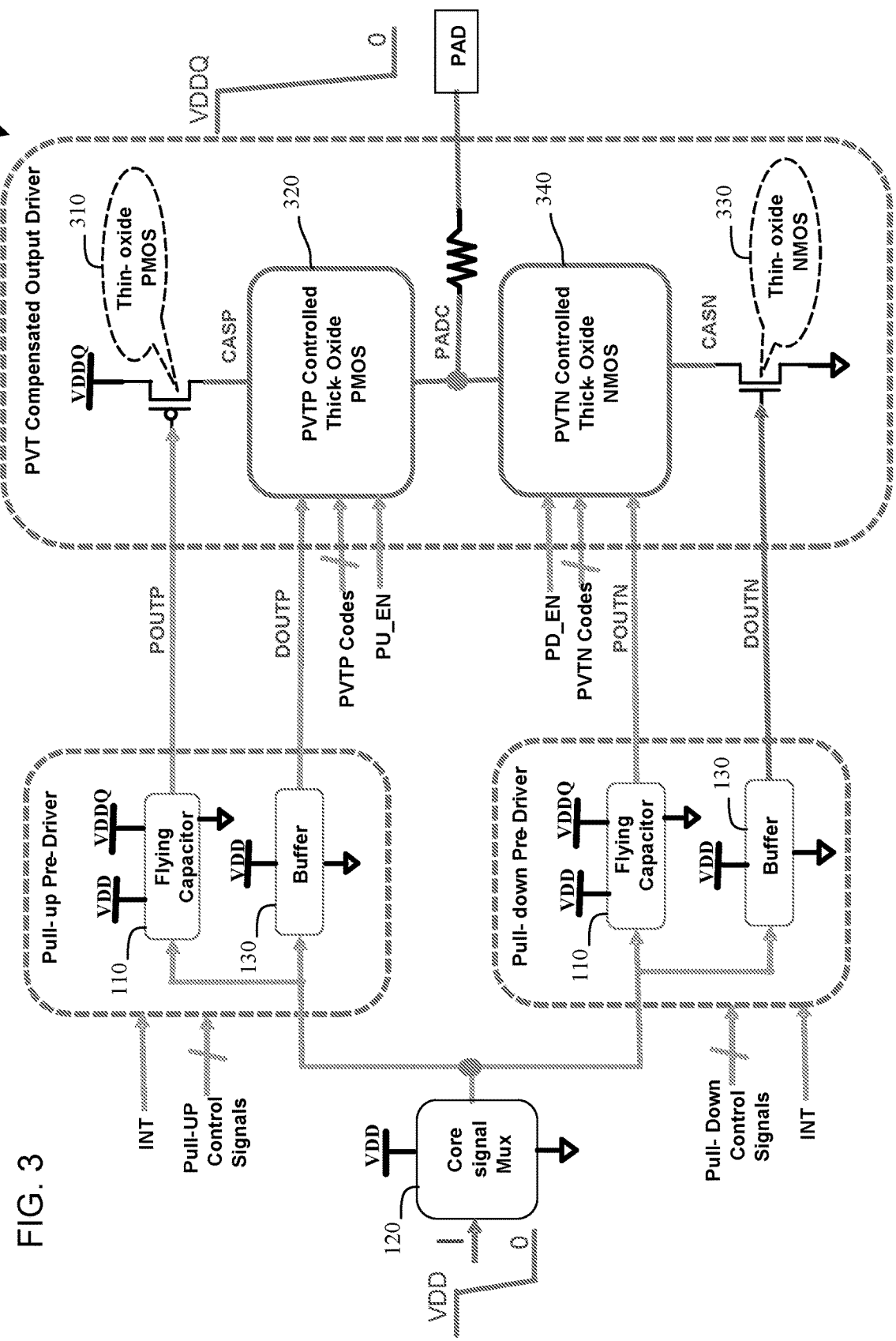
FIG. 3 is a block diagram illustrating transmitter architecture according to an example implementation.

FIG. 3 is a block diagram illustrating transmitter architecture 300 according to an example implementation. In some implementations, the transmitter architecture 300 comprises one or more flying capacitors 110, a core signal multiplexer 120, one or more buffers 130, a thin-oxide PMOS device 310 (i.e., positive channel metal oxide semiconductor "PMOS" device, a thick-oxide PMOS device 320, a thin-oxide NMOS device 330 (i.e., negative channel metal oxide semiconductor "NMOS" device), and a thick-oxide NMOS device 340. The pre-driver high-speed data signals are at a VDD voltage level (i.e., core voltage) and the data signals will be level shifted to VDDQ level (i.e., output voltage) at the output driver stage by using flying capacitors 110. For example, inputs to flying capacitors take a digital input of 0V (i.e., logic low) to VDD voltage level (i.e. logic high using a core voltage level) and level shift the inputs to give the outputs at VDDQ-VDD (i.e., logic low comprising output voltage level minus core voltage level) to VDDQ (i.e., logic high comprising output voltage level). This helps to reduce the dynamic power used by the transmitter architecture 300 as most of the switching stages in the data path are on VDD supply. In addition, the area used on the integrated circuit and/or the printed circuit board is reduced as thin-oxide core devices are smaller in area than thick-oxide I/O devices.

In some implementations, thin-oxide PMOS device 310 is part of a hybrid combination of thin-oxide and thick-oxide devices in the output driver. The thin-oxide PMOS device works as a data dependent pull-up switch and is driven by flying capacitor output (POUTP) which is phase aligned with digital data (DOUTP). The independent high-speed data pull up path as part of an independent pull-up and pull-down high-speed data path pair improves the transmitter performance and helps avoid the leaker on CASP and CASN nodes. The independent pull-up data path removes the coupling of the thin-oxide PMOS driver gate and thick-oxide NMOS driver gate. This also isolates the flying capacitor output (POUTP) connected to the thin-oxide PMOS gate from the leakage of PVTN controlled switch connected on thick-oxide NMOS gate. The PVTN signals correspond to PVT (process, voltage, temperature) dependent codes which are used to control the pull-down impedance across PVT with respect to the thick-oxide NMOS devices 340.

In some implementations the PVTP controlled thick-oxide PMOS devices 320 are used to protect the thin-oxide PMOS devices 310 from voltage stress and are dynamically driven by digital data (DOUTP).

In some implementations, the thin-oxide NMOS device 330 works as a data dependent pull-down switch and driven by digital data (DOUTN). The thin-oxide NMOS device 330 is protected from voltage stress by the thick-oxide NMOS device 340. In the pull-down path, the thin-oxide NMOS device 330 is employed to drive the output.

In some implementations, the thick-oxide NMOS devices 340 are PVTN Controlled and used to protect the thin-oxide NMOS device from the voltage stress and are dynamically driven by flying capacitor output (POUTN) which is phase aligned with digital data (DOUTN). The dynamic switching of the thick-oxide PMOS gate and thick-oxide NMOS gate are phase aligned with digital data.

Figure 4:
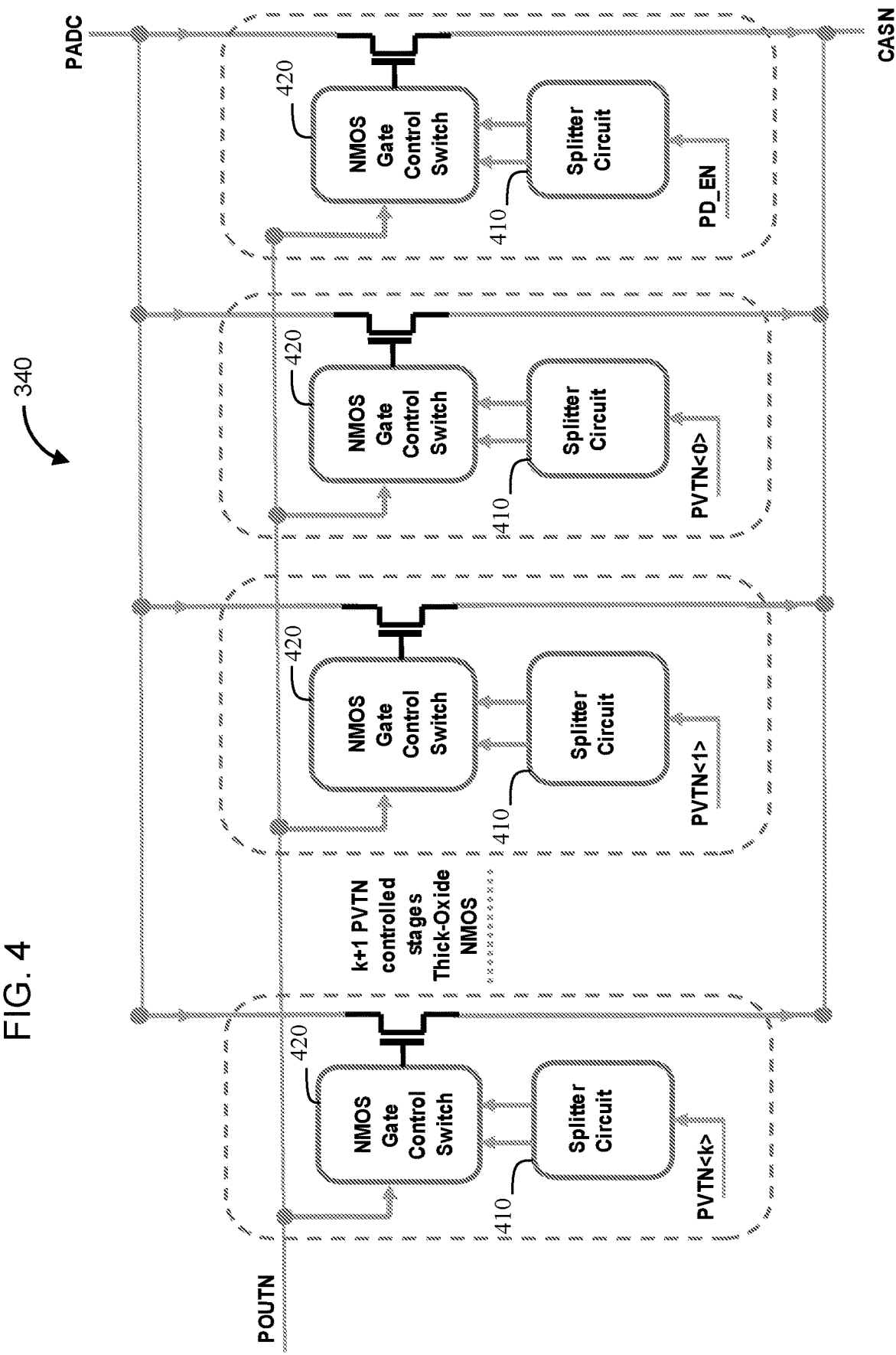
FIG. 4 is a block diagram illustrating the thick-oxide NMOS of FIG. 3 according to an example implementation.

FIG. 4 is a block diagram further illustrating the thick-oxide NMOS device 340 of FIG. 3 according to an example implementation. In some implementations, the thick-oxide NMOS devices are PVTN Controlled and used to protect the thin-oxide NMOS device from voltage stress and are dynamically driven by flying capacitor output (POUTN) which is phase aligned with digital data (DOUTN). The dynamic switching of the thick-oxide PMOS gate and thick-oxide NMOS gate are phase aligned with digital data.

The thick-oxide NMOS device 340 comprises an NMOS splitter circuit 410. In some implementations, the NMOS splitter circuit 410 removes the crowbar current of the NMOS gate control switch 420 and prevents the drainage of charge from the flying capacitor 110 output node (POUTN) when PVTN codes toggle during PVT codes refresh cycle of the transmitter. This allows for periodic refreshing of PVT codes for the output driver.

The thick-oxide NMOS device 340 comprises an NMOS gate control switch 420. In some implementations, the NMOS gate control switch 420 makes the strong logic high transition (e.g., using the output voltage, VDDQ voltage level) and the poor logic low transition (e.g., logic low of output voltage level minus core voltage level, VDDQ-VDD) on the thick-oxide NMOS gate node. This helps the fast turning on of the thick-oxide NMOS device 340 in the output driver and results in faster pull-down transition at the output.

Figure 5:
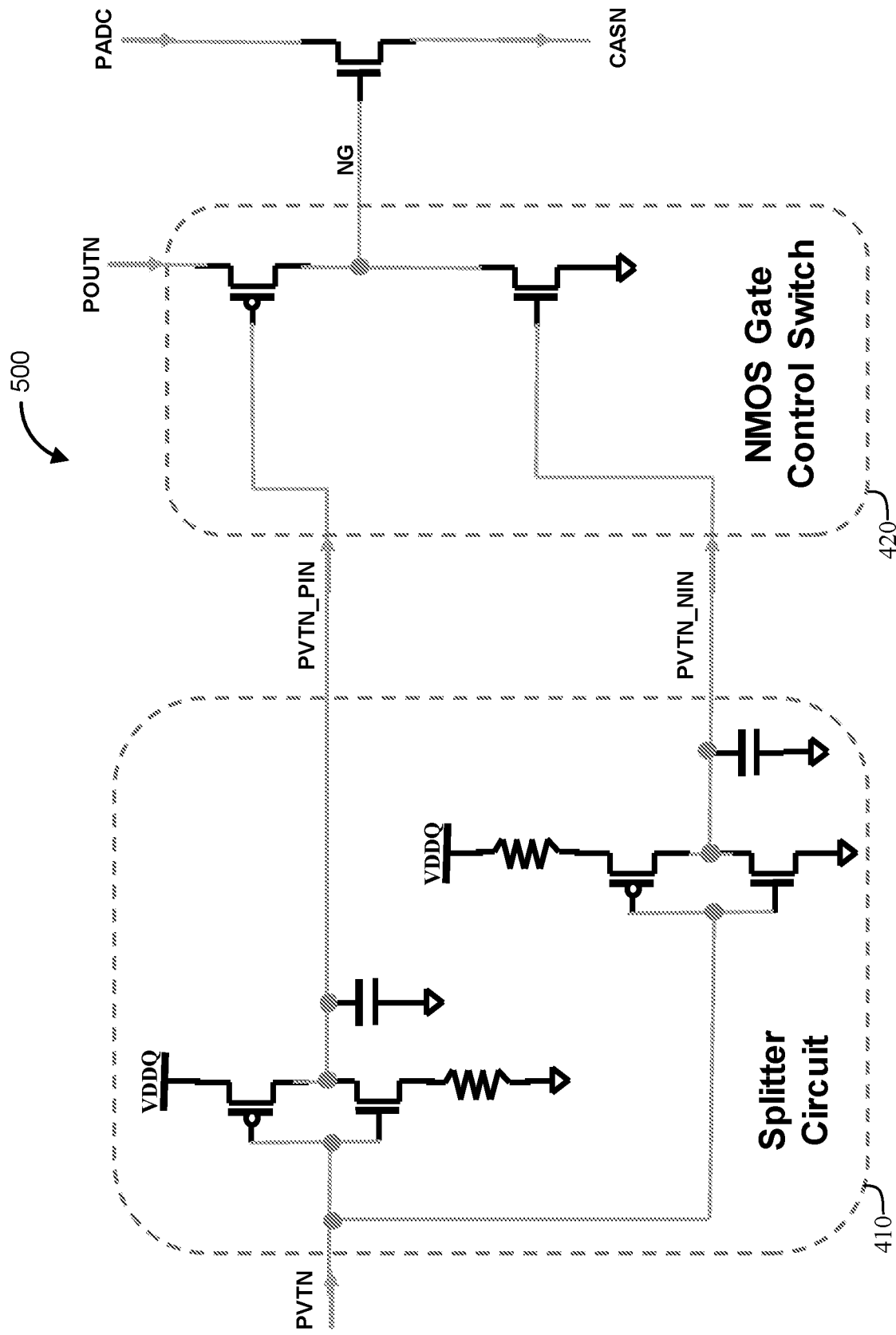
FIG. 5 is a block diagram illustrating the NMOS gate control switch and splitter circuit of FIG. 4 according to an example implementation.

FIG. 5 is a block diagram further illustrating the NMOS splitter circuit 410 and NMOS gate control switch 420 of FIG. 4 according to an example implementation. In some implementations, the NMOS splitter circuit 410 removes the crowbar current of the NMOS gate control switch 420 and prevents the drainage of charge from the flying capacitor 110 output node (POUTN) when PVTN codes toggle during PVT codes refresh cycle of the transmitter. This allows for periodic refreshing of PVT codes for the output driver. In some implementations, the NMOS gate control switch 420 makes the strong logic high transition (e.g., using the output voltage, VDDQ voltage level) and the poor logic low transition (e.g., logic low of output voltage level minus core voltage level, VDDQ-VDD) on the thick-oxide NMOS gate node. This helps the fast turning on of the thick-oxide NMOS device 340 in the output driver and results in faster pull-down transition at the output.

Figure 6:
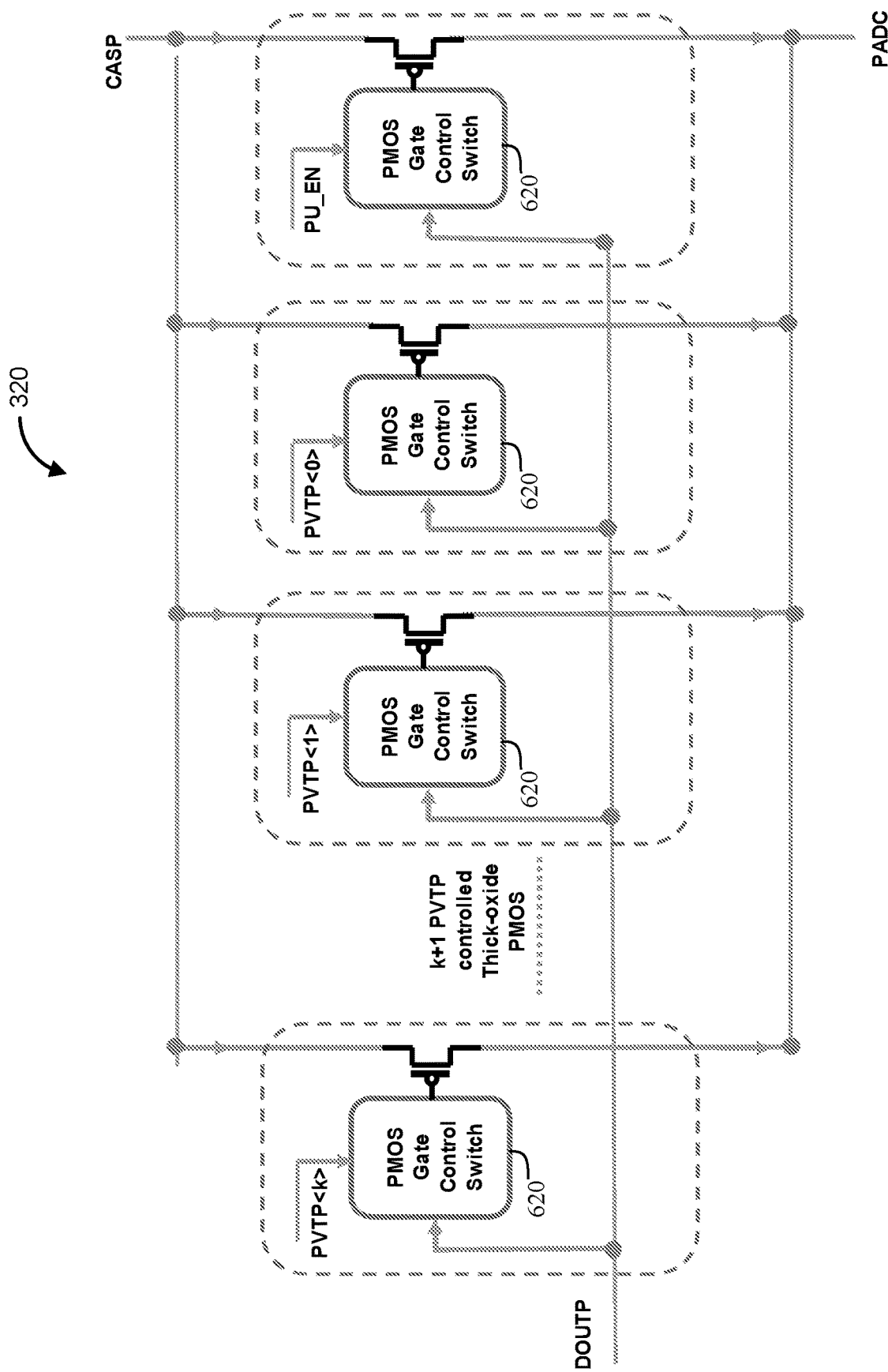
FIG. 6 is a block diagram illustrating the thick-oxide PMOS of FIG. 3 according to an example implementation.

FIG. 6 is a block diagram further illustrating the thick-oxide PMOS 320 of FIG. 3 according to an example implementation. In some implementations, the thick-oxide PMOS 320 comprises one or more PMOS gate control switch 620. In some implementations, the PMOS gate control switch 620 controls the transition on the thick-oxide PMOS gate. The PMOS gate control switch 620 controlling the transition on the thick-oxide PMOS gate makes the effective output pull-up transition at the output faster in order to achieve higher data rates (e.g., 18 Gbps). The PMOS gate control switch 620 makes the strong logic low transition (i.e., 0V) and the poor logic low transition (i.e., core voltage, VDD level) on the thick-oxide PMOS gate node. This helps the fast turning ON of the thick-oxide PMOS 320 in the output driver and results in faster pull-up transition at the driver output node.

Figure 7:
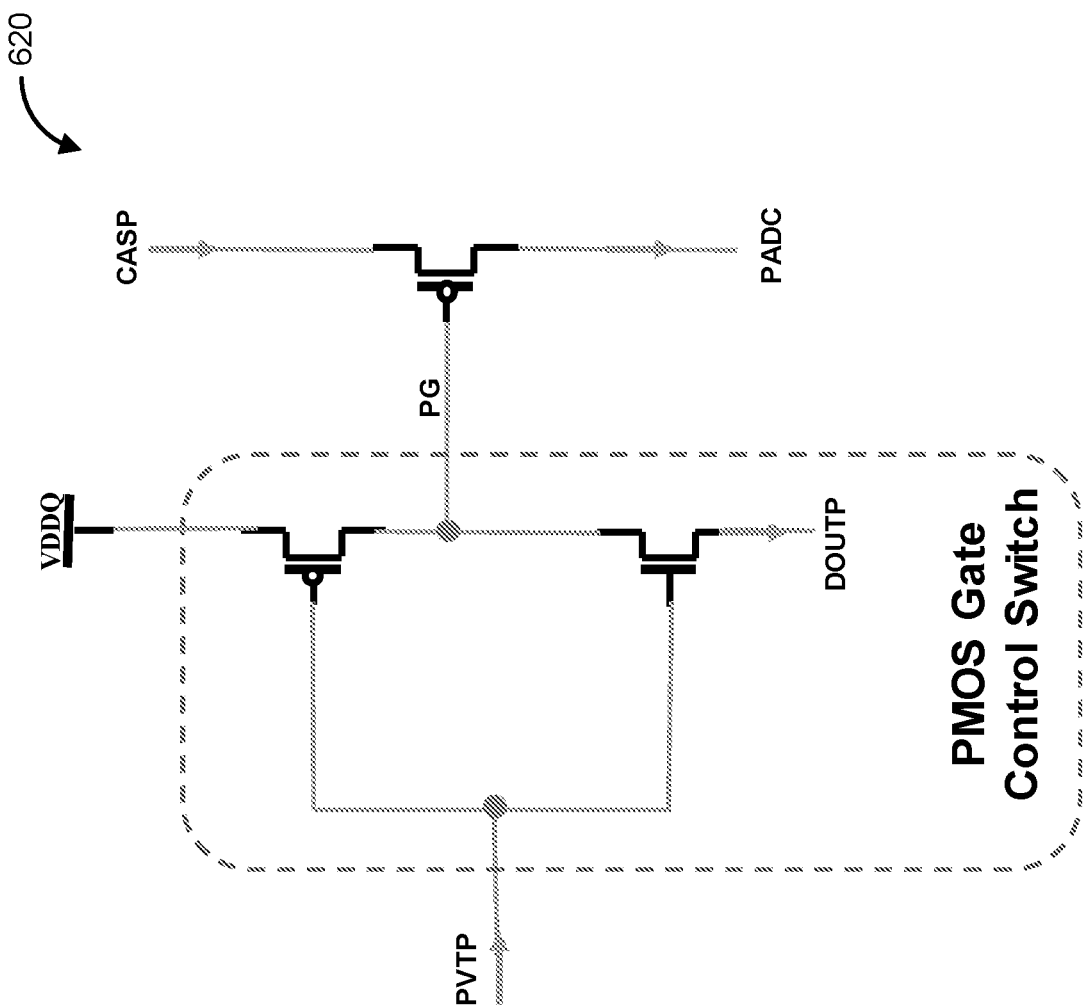
FIG. 7 is a block diagram illustrating the PMOS gate control switch of FIG. 6 according to an example implementation.

FIG. 7 is a block diagram further illustrating the PMOS gate control switch 620 of FIG. 6 according to an example implementation. In some implementations, the PMOS gate control switch 620 controls the transition on the thick-oxide PMOS gate. The PMOS gate control switch 620 controlling the transition on the thick-oxide PMOS gate makes the effective output pull-up transition at the output faster in order to achieve higher data rates (e.g., 18 Gbps). The PMOS gate control switch 620 makes the strong logic low transition (i.e., 0V) and the poor logic low transition (i.e., core voltage, VDD level) on the thick-oxide PMOS gate node. This helps the fast turning ON of the thick-oxide PMOS 320 in the output driver and results in faster pull-up transition at the driver output node.

Although the present implementations have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A circuit for data transmission of comprising:
   a pull-up data path comprising a first flying capacitor, a first buffer, a thin-oxide PMOS device, and a thick-oxide PMOS device;
   a pull-down data path comprising a second flying capacitor, a second buffer, a thin-oxide NMOS device, and a thick-oxide NMOS device; and
   wherein the pull-up data path and the pull-down data path are operatively connected to a core data output signal line, and
   wherein the first buffer and first flying capacitor are operatively connected in parallel to the core data output signal line, such that the core data output signal line is an input of the first flying capacitor, and the core data output signal line is also an input of the first buffer, and
   wherein an output of the first flying capacitor is phase aligned with a parallel output of the first buffer and used to drive the thin-oxide PMOS device.

2. The circuit of claim 1, wherein the thin-oxide PMOS device is configured as a data dependent pull-up switch and is driven by an output of the first flying capacitor.

3. The circuit of claim 1, wherein the thick-oxide PMOS device is driven by the phase aligned output of the first buffer.

4. The circuit of claim 1, wherein the thin-oxide NMOS device is configured as a data dependent pull-down switch and is driven by an output of the second buffer.

5. The circuit of claim 1, wherein the second buffer and second flying capacitor are operatively connected to the core data output signal line where the core data output signal line is an input of the second flying capacitor, where the core data output signal line is an input of the second buffer, and wherein an output of the second flying capacitor is phase aligned with an output of the second buffer and used to drive the thick-oxide NMOS device.

6. The circuit of claim 5, wherein the thick-oxide NMOS device is driven by the phase aligned output of the second flying capacitor.

7. The circuit of claim 1, wherein the second buffer and second flying capacitor are operatively connected to the core data output signal line where the core data output signal line is an input of the second flying capacitor, where the core data output signal line is an input of the second buffer, and wherein an output of the second flying capacitor is phase aligned with an output of the second buffer and used to drive the thick-oxide NMOS device.

8. The circuit of claim 7, wherein the thick-oxide NMOS device is driven by the phase aligned output of the second flying capacitor.

9. A method comprising:
receiving a data signal at a first voltage level;
splitting the data signal to a pull-up data path and a pull-down data path;
level shifting the pull-up data path signal using a first flying capacitor;
level shifting the pull-down data path signal using a second flying capacitor;
combining the pull-up data path signal and the pull-down data path signal to create an output data signal at a second voltage level;
splitting the pull-up data path signal for performing the level shifting in parallel with performing buffering of the pull-up data path signal;
buffering the pull-up data path signal using a first buffer operating on the first voltage level;
splitting the pull-down data path signal for performing the level shifting in parallel with performing buffering of the pull-down data path signal;
buffering the pull-down data path signal using a second buffer operating on the first voltage level;
phase aligning the level shifted pull-up data path signal and the buffered pull-up data path signal; and
phase aligning the level shifted pull-down data path signal and the buffered pull-down data path signal.

10. The method of claim 9, further comprising:
driving a thin-oxide PMOS device using the phase aligned level shifted pull-up data path signal;
driving a thick-oxide PMOS device using the phase aligned buffered pull-up data path signal;
driving a thick-oxide NMOS device using the phase aligned level shifted pull-down data path signal; and
driving a thin-oxide NMOS Device using the phase aligned buffered pull-down data path signal.

11. The method of claim 9, further comprising:
phase aligning the level shifted pull-up data path signal and the pull-up data path signal; and
phase aligning the level shifted pull-down data path signal and the pull-down data path signal.

12. A method comprising:
receiving a data signal at a first voltage level;
splitting the data signal to a pull-up data path and a pull-down data path;
level shifting the pull-up data path signal using a first flying capacitor;
level shifting the pull-down data path signal using a second flying capacitor;
combining the pull-up data path signal and the pull-down data path signal to create an output data signal at a second voltage level;
phase aligning the level shifted pull-up data path signal and the pull-up data path signal;
phase aligning the level shifted pull-down data path signal and the pull-down data path signal;
driving a thin-oxide PMOS device using the phase aligned level shifted pull-up data path signal;
driving a thick-oxide PMOS device using the phase aligned pull-up data path signal;
driving a thick-oxide NMOS device using the phase aligned level shifted pull-down data path signal; and
driving a thin-oxide NMOS Device using the phase aligned pull-down data path signal.

* * * * *